(12) United States Patent
Kim et al.

(10) Patent No.: US 8,630,097 B2
(45) Date of Patent: Jan. 14, 2014

(54) POWER MODULE USING SINTERING DIE ATTACH AND MANUFACTURING METHOD THEREOF

(75) Inventors: Tae Hyun Kim, Seoul (KR); Yong Hui Joo, Gyunggi-do (KR); Seog Moon Choi, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 324 days.

(21) Appl. No.: 13/007,485

(22) Filed: Jan. 14, 2011

(65) Prior Publication Data
US 2012/0106109 A1    May 3, 2012

(30) Foreign Application Priority Data

Nov. 2, 2010 (KR) .......................... 10-2010-0108340

(51) Int. Cl.
*H05K 7/10* (2006.01)
(52) U.S. Cl.
USPC ........... 361/767; 361/768; 361/771; 361/807; 361/808; 361/813; 174/259; 174/520; 174/536; 174/548
(58) Field of Classification Search
USPC ......... 174/259, 260, 520, 534, 535–538, 540, 174/541, 548; 361/760.767, 768, 771, 782, 361/807, 808, 811–813
See application file for complete search history.

(56) References Cited

U.S. PATENT DOCUMENTS

| | | | | |
|---|---|---|---|---|
| 4,005,454 A | * | 1/1977 | Froloff et al. | 257/747 |
| 4,495,378 A | * | 1/1985 | Dotzer et al. | 174/252 |
| 6,882,544 B2 | * | 4/2005 | Nakamura et al. | 361/765 |
| 7,766,218 B2 | * | 8/2010 | Yamakawa et al. | 228/248.1 |
| 7,832,588 B2 | * | 11/2010 | Suzuki | 220/475 |
| 2007/0131912 A1 | * | 6/2007 | Simone et al. | 252/500 |
| 2007/0262387 A1 | * | 11/2007 | Nonaka et al. | 257/356 |
| 2009/0261472 A1 | * | 10/2009 | Bayerer | 257/719 |
| 2010/0127383 A1 | | 5/2010 | Oka et al. | |
| 2010/0294543 A1 | * | 11/2010 | Sohn et al. | 174/252 |

FOREIGN PATENT DOCUMENTS

| | | |
|---|---|---|
| JP | 2004-179224 | 6/2004 |
| JP | 2006-352080 | 12/2006 |
| JP | 2007-095984 | 4/2007 |
| JP | 2009-206482 | 9/2009 |
| KR | 1020040082297 A | 9/2004 |

OTHER PUBLICATIONS

Office Action from counterpart Japanese Patent Application No. 2011-007046, mailed Oct. 2, 2012, 4 pages, English Summary included.
Office Action from counterpart Korean Patent Application No. 10-2010-0108340, mailed Feb. 28, 2012, 4 pages.

\* cited by examiner

*Primary Examiner* — Hoa C Nguyen
(74) *Attorney, Agent, or Firm* — Bracewell & Giuliani LLP

(57) ABSTRACT

Disclosed herein are a power module using sintering die attach and a manufacturing method of the same. The power module includes: a substrate having an insulating layer formed on a surface of a metal plate; a circuit layer formed on the substrate and including a wiring pattern and an electrode pattern; a device mounted on the wiring pattern; a sintering die attach layer applying a metal paste between the wiring pattern and the device and sintering the metal paste to bond the wiring pattern to the device; and a lead frame electrically connecting the device to the electrode pattern, whereby making it possible to simplify and facilitate the process, increase electrical efficiency and improve radiation characteristics, and manufacture firm and reliable power module.

7 Claims, 3 Drawing Sheets

POWER MODULE USING SINTERING DIE ATTACH AND MANUFACTURING METHOD THEREOF

CROSS REFERENCE TO RELATED APPLICATION

This application claims the benefit of Korean Patent Application No. 10-2010-0108340, filed on Nov. 2, 2010, entitled "Power Module Using Sintering Die Attach And Manufacturing Method Thereof", which is hereby incorporated by reference in its entirety into this application.

BACKGROUND OF THE INVENTION

1. Technical Field

The present invention relates to a power module using sintering die attach and a manufacturing method thereof.

2. Description of the Related Art

An existing power module was manufactured by bonding an insulated gate bipolar transistor (IGBT), a diode chip and the like to a copper (Cu) lead frame or a direct bonding Cu (DBC) substrate and electrically connecting between the substrate and the housing by an aluminum (Al) wire bonding method.

At this time, the chip is bonded to the substrate using Sn-based solder.

Therefore, the lower portions of the IGBT and the diode chip are made of metal such as silver (Ag) and gold (Au), which can be easily soldered, and the substrate is finished using metal such as copper (Cu), nickel (Ni) or the like.

However, the existing chip bonding method has difficulties in being applied to a high-power electrical device module due to tin (Sn)-based low thermal conductivity (<60 W/m·k), formation of an inter metallic contact (IMC), and low reliability of a material itself.

In addition, the existing chip bonding method also has a problem of degradation in efficiency due to low radiation characteristics.

Meanwhile, in the power module, most of the heat generated at the time of using thereof is discharged to the substrate through the lower portion of the chip.

In order to radiate heat through the substrate as described above, a bonding material between the chip and the substrate should have excellent radiation characteristics.

If cracks occur in the lower portion of the chip due to long use of the power module, it leads to degradation in radiation characteristics and as a result, it also leads to malfunction of the device, thereby causing economic loss.

SUMMARY OF THE INVENTION

The present invention has been made in an effort to provide a power module using sintering die attach having high electrical efficiency and excellent radiation characteristics, and a manufacturing method of the same.

According to a preferred embodiment of the present invention, there is provided a power module using sintering die attach, including: a substrate having an insulating layer formed on a surface of a metal plate; a circuit layer formed on the substrate and including a wiring pattern and an electrode pattern; a device mounted on the wiring pattern; a sintering die attach layer applying a metal paste between the wiring pattern and the device and sintering the metal paste to bond the wiring pattern to the device; and a lead frame electrically connecting the device to the electrode pattern.

The substrate may be an anodized metal substrate (AMS).

The metal plate may be any one of aluminum (Al), an aluminum (Al) alloy and copper (Cu).

The insulating layer may be aluminum oxide ($Al_2O_3$).

The device may be a wafer pretreated device.

The metal paste may have a ratio of a micro-sized metal powder and a nano-sized metal powder of 7:3.

The metal powder may be at least one of titanium (Ti), copper (Cu), nickel (Ni) and gold (Au).

The power module using sintering die attach may further include a solder bonding layer bonding the device to one end of the lead frame and bonding the electrode pattern to the other end of the lead frame.

The device may be wafer pretreated to have the metal paste applied to the lower to portion thereof at a thickness of 5 μm to 10 μm.

According to another preferred embodiment of the present invention, there is provided a manufacturing method of a power module using sintering die attach, including: (A) preparing a substrate formed by oxidizing a surface of a metal plate and having an insulating layer formed on the entire surface thereof; (B) forming a circuit layer including a wiring pattern and an electrode pattern on the substrate; (C) after mounting a device on the wiring pattern, applying a metal paste onto the wiring pattern so as to bond the wiring pattern to the device and then sintering the metal paste; and (D) soldering the device to one end of the lead frame and the electrode pattern to the other end of the lead frame so as to electrically connect the device to the electrode pattern.

The manufacturing method of a power module using sintering die attach further includes performing a wafer pretreatment on the device, before mounting the device.

At step (E), the performing the wafer pretreatment may include: preparing a wafer substrate on which a plurality of devices are mounted; applying a metal paste to a lower portion of the wafer substrate at a thickness of 5 μm to 10 μm and drying the metal paste; and sawing the plurality of devices mounted on the wafer substrate into a separate device.

Step (A) may include: (A-1) preparing a metal plate; and (A-2) oxidizing the surface of the metal plate and forming an insulating layer on the entire surface thereof.

At step (B), the wiring pattern and the electrode pattern may be formed by any one of a plating method, a sputtering method, and a deposition method.

At step (C), when the metal paste is applied onto the wiring pattern, any one of a silk screen method, a metal screen method, a stamping method, and a dispensing method may be used.

At step (C), a sintering temperature of the metal paste may be between about 250° C. to about 300° C.

DESCRIPTION OF THE PREFERRED EMBODIMENTS

Figure 1:
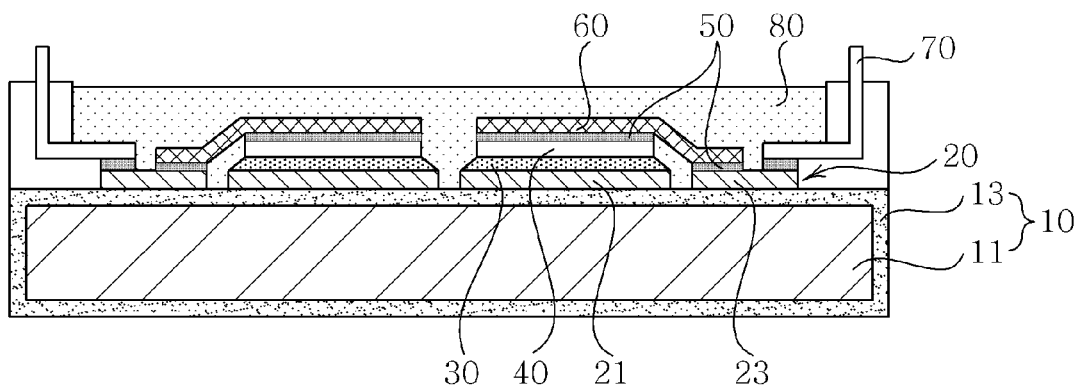
FIG. 1 is a cross-sectional view of a power module using sintering die attach according to a preferred embodiment of the present invention.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

Hereinafter, preferred embodiments of the present invention will be described in detail with reference to the accompanying drawings.

FIG. 1 is a cross-sectional view of a power module having a sintering die attach structure according to a preferred embodiment of the present invention.

Referring to FIG. 1, a power module 100 using sintering die attach according to a preferred embodiment of the present invention is configured to include a substrate 10 formed with a metal plate 11 and an insulating layer 13 formed on the surface of the metal plate 11, a circuit layer 20 formed with a wiring pattern 21 and an electrode pattern 23 formed on the substrate 10, a device 40 mounted on the wiring pattern 21 of the circuit layer 20, a sintering die attach layer 30 formed by applying a metal paste between the wiring pattern 21 and the device 40 and sintering the metal paste so as to bond the wiring pattern 21 to the device 40, a lead frame 60 electrically connecting the device 40 to the electrode pattern 23, and a solder bonding layer 50 bonding the device 40 to one end of the lead frame 60 and the electrode pattern 23 to the other end of the lead frame 60.

In the present embodiment, when the device 40 such as a semiconductor chip is mounted on the substrate 10, in order to perform a sintering process when they are bonded to each other by a sintering method, the substrate should have high coplanarity (for example, in 10 μm) and excellent stiffness (that is, minimum deformation due to pressure and temperature). Furthermore, the upper and lower portions of the substrate 10 should be identical with each other.

However, the direct bonded copper (DBC) substrate and the lead frame substrate, which have been mainly used in the prior art, each have the following disadvantages:

First, in the case of the DBC substrate, although it has excellent stiffness and coplanarity, it should attach again a radiating plate to the lower portion of the DBC substrate using solder in order to improve thermal conductivity. Furthermore, the thermal conductivity is decreased and reliability is degraded due to the solder layer in the lower portion of the device.

On the other hand, in the case of the lead frame substrate, it is difficult to implement a complicated circuit and the radiation characteristics are not excellent, thereby having to difficulties in being applied to a high-power module having high-voltage and high-current.

In a preferred embodiment of the present invention, an anodized metal substrate (AMS) 10 is used, the AMS being capable of supplementing the disadvantages of the DBC substrate and the lead frame substrate.

The AMS 10 is a substrate formed by oxidizing the surface of a thick metal plate 11 and having an insulating layer 13 formed on the surface thereof.

The insulating layer 13 is formed as an oxide film such as aluminum oxide ($Al_2O_3$) by oxidizing the entire surface of the metal plate 11 using an anodizing method or the like.

In addition, the insulating layer 13 may also be formed by bonding a ceramic layer or an epoxy layer to the entire surface of the metal plate 11.

As the metal plate 11, aluminum (Al), an aluminum (Al) alloy, copper (Cu), or the like may be used by way of example.

The AMS 10 configured as described above not only has excellent stiffness and coplanarity but also is made of the metal plate 11, thereby also having excellent radiation characteristics.

The circuit layer 20 including the wiring pattern 21 and the electrode pattern 23 is formed on the AMS 10 at a predetermined thickness and pattern, the wiring pattern 21 on which the device 40 such as a semiconductor chip is to be mounted and the electrode pattern 23 electrically connected to the device 40 to supply power to the device 40 from the outside.

The circuit layer 20 is formed on the AMS 10 at a thickness of about 1 μm in a predetermined shape by plating, sputtering, depositing, or the like titanium (Ti), copper (Cu), nickel (Ni), gold (Au), or the like.

In this case, the outermost surface of the circuit layer 20 may be preferably finished using silver (Ag).

This is to further facilitate bonding at the time of sintering die attach, since the metal paste applied in order to mount the device 40 on the wiring pattern 21 is mainly made of silver (Ag) paste.

As described above, the sintering die attach layer 30 is formed by applying the metal paste between the wiring pattern 21 and the device 40 and sintering the metal paste so as to bond the wiring pattern 21 to the device 40, wherein a sintering temperature is between about 250° C. to about 30° C.

The power module 100 in which the device 40 is mounted on the wiring pattern 21 by the sintering die attach layer 30 has more excellent radiation characteristics than a power module in which the device 40 is mounted on the wiring pattern 21 by the existing solder bonding layer.

More specifically, the existing solder bonding layer has low thermal conductivity of about 60 W/m·k., whereas the sintering die attach layer 30 in the present invention has high thermal conductivity of about 250 W/m·k., such that the radiation characteristics of the power module 100 bonded by the sintering die attach 30 are also improved.

In addition, high pressure of about 40 Mpa is required at the time of bonding by the existing solder bonding layer, such that a problem may occur in that the insulating layer 13 is broken or the circuit layer 20 is detached.

However, at the time of bonding by the sintering die attach layer 30 according to the present invention, the device 40 is mounted on the sintering die attach layer 30 to be sintered without being pressed with high pressure, such that a stable sintering bonding can be obtained only using pressure of about 10 to about 20 Mpa, which solves the problem.

In addition, after being sintered to be bonded, the sintering die attach layer 30 has a melting point of about 900° C. similar to that of pure silver (Ag).

If the wiring pattern 21 is bonded to the device 40 by the sintering die attach layer 30, the sintering die attach layer 30 has a high melting point even when the device 40 is bonded to the lead frame 60 thereafter, such that remelting does not occur.

Therefore, it is possible to prevent voids from being formed in the sintering die attach layer 30 and solve problems of degradation in reliability or chip tilting due to the voids.

In the metal paste forming the sintering die attach layer 30 according to the present invention, micro-sized metal powder, nano-sized metal powder, and the like are mixed at a predetermined ratio.

The metal paste is a composition in which a solvent, a dispersing agent, a thinner, a binder, and the like are mixed, in addition to the micro-sized metal powder and the nano-sized metal powder.

In this case, the micro-sized metal powder and the nano-sized metal powder may be the same kind or different kinds of metal powder.

As the metal powder, gold (Au), silver (Ag), tin (Sn), indium (In), copper (Cu), or the like may be used by way of example.

When the metal paste in which the micro-sized metal powder and the nano-sized metal powder are mixed at a predetermined ratio is used as the sintering die attach layer 30 as in the present invention, the sintering characteristics are further improved as compared to a case in which only the same-sized metal powder is used.

More specifically, the sintering die attach layer 30 made of the metal paste in which the micro-sized metal powder is mixed with the nano-sized metal powder has an increased surface area as compared to the existing case in which a metal paste made of only the micro-sized metal powder is used, and thus, sintering driving force resulted therefrom is increased as compared to the case in which the metal paste is used, thereby making it possible to lower the sintering temperature.

On the other hand, the sintering die attach layer 30 according to the present invention has a relatively low content of a solvent including a dispersing agent, a thinner, a binder, and the like, with respect to the metal powder, as compared to the existing case in which the metal paste made of only the nano-sized metal powder is used.

Therefore, at the time of sintering, the solvent may be easily volatilized to be completely burnt, thereby making it possible to prevent voids from forming in the inside of the sintering die attach layer 30 or in the lower portion of the device 40.

In this case, in the metal paste used in the sintering die attach layer 30 according to the present invention, a size of the micro-sized metal powder may be about 3.5 µm to 7.5 µm, and preferably, about 5 µm or less. In addition, a size of the nano-sized metal powder may be 10 nm to 50 nm, and preferably, about 30 nm or less.

Meanwhile, the ratio of the micro-sized metal powder and the nano-sized metal powder may preferably be 7:3 or 8:2.

In particular, when the micro-sized metal powder includes tin (Sn) and indium (In), the content ratio of the tin (Sn) may preferably be 2.5 or less.

The sintering temperature of the sintering die attach layer 30 using the metal paste having the size of the metal powder and the composition ration as described above is about 250° C. to 300° C., with assistance of external pressure.

In this case, as a solvent used in the metal paste, an organic material may be used, the organic material having characteristics that it is completely volatilized at a temperature of about 250° C.

This is to prevent the metal paste from forming the sintering die attach layer 30 from causing the bonding between metal powder before it reaches the sintering temperature (about 250° C. to 300° C.), thereby preventing the generation of interdiffusion and bonding the device 40 on the wiring pattern 21 at an actual sintering temperature.

The solder bonding layer 50 is a bonding layer for soldering the device 40 and one end of the lead frame 60 so as to be bonded to each other and soldering the electrode pattern 23 and the other end of the lead frame 60 so as to be bonded to each other.

Both ends of the lead frame 60 are each bonded to the device 40 and the electrode pattern 23 to electrically connect the device 40.

In common modules, a wire bonding is generally used for electrical wiring of the device 40; however, the lead frame 60 is used in the present invention, thereby completing more firm and reliable power module 100.

FIGS. 2 to 8 are diagrams explaining a manufacturing method of a power module using sintering die attach according to a preferred embodiment of the present invention.

Figure 2:
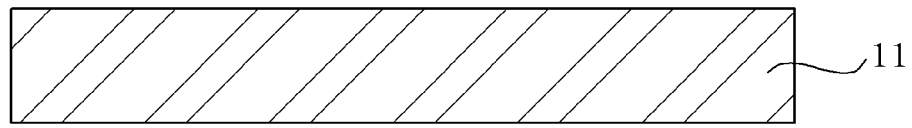
FIGS. 2 to 8 are diagrams explaining a manufacturing method of a power module using sintering die attach according to a preferred embodiment of the present invention.

First, as shown in FIG. 2, a metal plate 11 is prepared.

Figure 3:
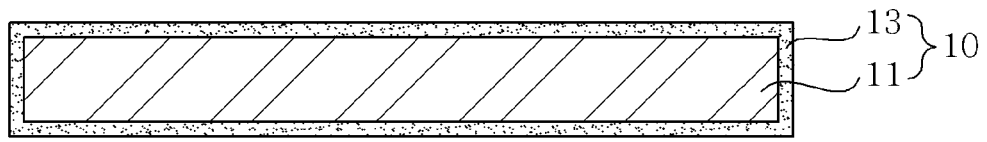

Then, as shown in FIG. 3, an insulating layer 13 is formed over the surface of the metal plate 11.

In this case, the insulating layer 13 may form an oxide film such as aluminum oxide ($Al_2O_3$) by oxidizing the entire surface of the metal plate 11 using an anodizing method.

A substrate formed by oxidizing a surface of the metal plate 11 and having the insulating layer 13 formed thereon is called an anodized metal substrate (AMS) 10.

In addition, the insulating layer 13 may also be formed by bonding a ceramic layer or an epoxy layer to the surface of the metal plate 11.

Figure 4:
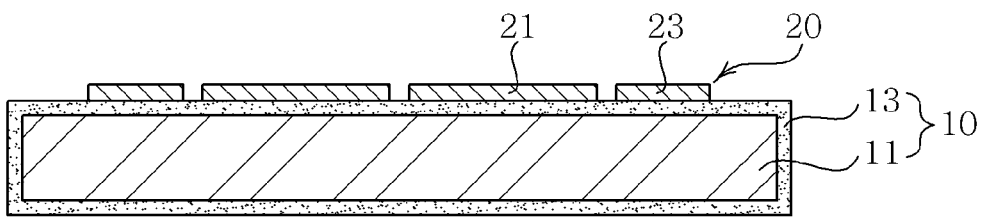

Then, as shown in FIG. 4, a circuit layer 20 including a wiring pattern 21 and an electrode pattern 23 is formed on the AMS 10 at a predetermined thickness.

In this case, the circuit layer 20 is formed on the AMS 10 at a thickness of about 1 µm by plating, sputtering, depositing, and the like a metal such as titanium (Ti), copper (Cu), nickel (Ni), gold (Au), or the like.

Figure 5:
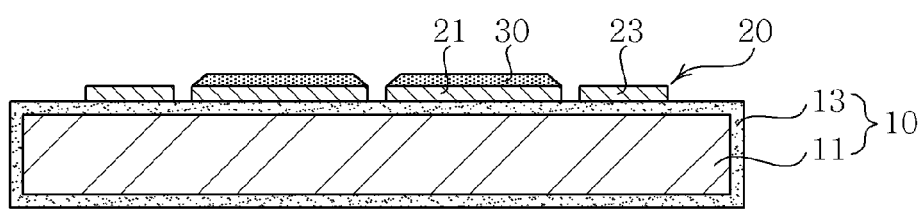
Figure 6:
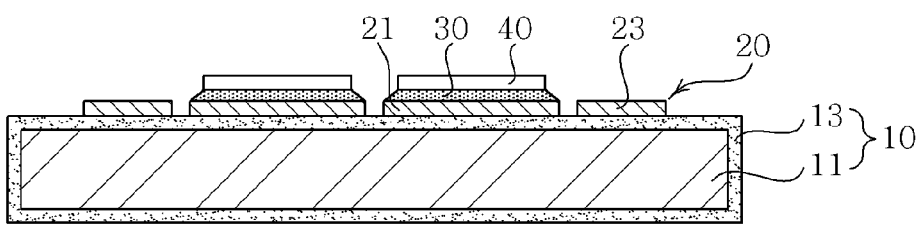

Then, as shown in FIG. 5, a metal paste is applied onto the wiring pattern 21 in order to mount a device 40 on the wiring pattern 21.

When the metal paste is applied onto the wiring pattern 21, a silk screen method, a metal screen method, a stamping method, a dispensing method, or the like is used.

Then, the device 40 is mounted and sintered on the metal paste at a temperature between about 250° C. to about 300° C. to so as to be bonded.

If the metal paste is sintered as described above, a sintering die attach layer 30 bonding the wiring pattern 21 to the device 40 is formed between the wiring pattern 21 and the device 40.

In this configuration, as the device 40, a wafer pretreated device is used.

The wafer pretreated device means a device subjected to thinly applying and drying a metal paste mixed at a predetermined ratio to a lower portion of a wafer substrate at a thickness of about 5 to 15, preferably, about 10 or less before sawing the wafer substrate on which a plurality of devices are mounted, and then sawing each of them into a separate device.

In other words, a metal paste mixed at a predetermined ratio according to the present invention is thinly applied on the lower portion of the wafer pretreated device.

The metal paste thinly applied to the lower portion of the device 40 allows the device 40 to be mounted on the metal paste thickly applied on the wiring pattern 21 at a thickness of about 40 µm to 60 µm, preferably, about 50 µm, thereby further facilitating the bonding thereof and strengthening the adhesion thereof at the time of sintering.

After the device 40 is mounted on the wiring pattern 21 of the AMS 10, a soldering process for electrically connecting the device 40 to the electrode pattern 23 is performed.

Figure 7:
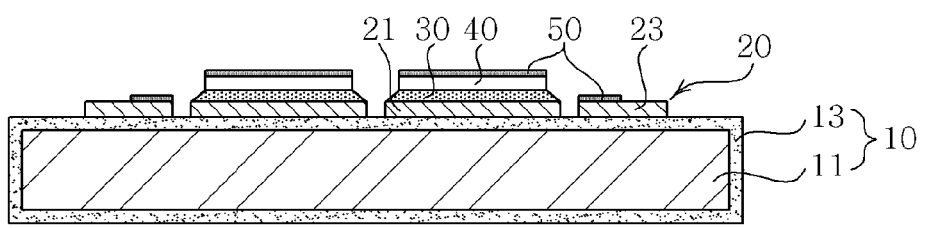

As shown in FIG. 7, a solder bonding layer 50 is formed on the device 40 and the electrode pattern 23 in order to bond a lead frame 60 connecting the device 40 to the electrode pattern 23.

Figure 8:
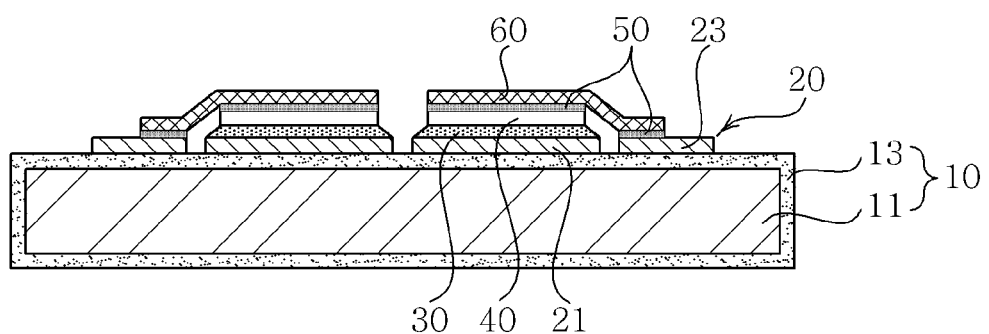

Then, as shown in FIG. 8, a predetermined pressure is applied so that one end of the lead frame 60 is bonded to the device 40 and the other end of the lead frame 60 is bonded to the electrode pattern 23 by the solder bonding layer 50.

Finally, a synthetic resin 80 or the like is applied to be sealed in order to protect the device 40 and the circuit layer 20 and a bus 70 bonded to the electrode pattern 23 to be connected to the outside is provided, the power module 100 as shown in FIG. 1 is completed.

According to the power module 100 using the sintering die attach and the manufacturing method of the same according to the present invention, the thin chip can be bonded using a sintering method, thereby making it possible to increase electrical efficiency and improve radiation characteristics.

In addition, according to the present invention, the sintering method is used so as not to necessitate the need to apply high pressure, thereby making it possible to simplify and facilitate the bonding process as well as prevent breakage of the substrate or the thin chip.

In addition, as the wiring for electrical connection with the device 40, the lead frame 60 is used instead of common wires, thereby making it possible to complete a more firm and reliable power module 100.

With the power module using sintering die attach and a manufacturing method of the same according to the present invention, after the metal paste is applied to the substrate and the thin device is mounted thereon, the metal paste is sintered to bond them, thereby making it possible to simplify and facilitate the bonding process and prevent the breakage due to pressure generated at the time of the existing bonding by soldering.

In addition, according to the present invention, the lower portion of the device is bonded to the substrate by the metal paste to easily discharge heat generated at the time of operating the power module through the lower portion of the device, thereby making it possible to improve radiation characteristics and increase electrical efficiency accordingly.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A power module using sintering die attach, comprising:
a substrate made by anodizing a metal plate which has uniform thickness and a surface of the substrate surrounded by an insulating layer composed of oxide film;
a circuit layer on the substrate and including a wiring pattern and an electrode pattern;
a device mounted on the wiring pattern which has a metal paste on the bottom surface through wafer pretreatment process;
a sintering die attach layer applying a metal paste between the wiring pattern and the device and sintering the metal paste to bond the wiring pattern to the device; and
a lead frame electrically connecting the device to the electrode pattern.

2. The power module using sintering die attach as set forth in claim 1, wherein the metal plate is any one of aluminum (Al), an aluminum (Al) alloy and copper (Cu).

3. The power module using sintering die attach as set forth in claim 1, wherein the insulating layer is aluminum oxide ($Al_2O_3$).

4. The power module using sintering die attach as set forth in claim 1, wherein the metal paste has a ratio of a micro-sized metal powder and a nano-sized metal powder of 7:3.

5. The power module using sintering die attach as set forth in claim 4, wherein the metal powder is at least one of titanium (Ti), copper (Cu), nickel (Ni) and gold (Au).

6. The power module using sintering die attach as set forth in claim 1, further comprising a solder bonding layer bonding the device to one end of the lead frame and bonding the electrode pattern to the other end of the lead frame.

7. The power module using sintering die attach as set forth in claim 1, wherein the device is water pretreated to have the metal paste applied to the lower portion thereof at a thickness of 5 μm to 15 μm.

* * * * *